(12) United States Patent  
Tanaka et al.

(10) Patent No.: US 8,558,341 B2  
(45) Date of Patent: Oct. 15, 2013

(54) PHOTOELECTRIC CONVERSION ELEMENT

(75) Inventors: Koichiro Tanaka, Kanagawa (JP); Fumito Isaka, Kanagawa (JP); Jiro Nishida, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 120 days.

(21) Appl. No.: 13/323,924

(22) Filed: Dec. 13, 2011

(65) Prior Publication Data

US 2012/0153416 A1 Jun. 21, 2012

(30) Foreign Application Priority Data

Dec. 17, 2010 (JP) ................................. 2010-282126

(51) Int. Cl.
*H01L 31/075* (2012.01)
*H01L 31/105* (2006.01)
*H01L 31/117* (2006.01)

(52) U.S. Cl.
USPC .................... 257/458; 257/464; 257/E29.336; 257/E31.057

(58) Field of Classification Search
USPC ............. 257/53, 458, 464, E29.336, E31.057
See application file for complete search history.

(56) References Cited

U.S. PATENT DOCUMENTS

| | | | |
|---|---|---|---|
| 7,301,215 B2 | 11/2007 | Kariya | |
| 2005/0145972 A1* | 7/2005 | Fukuda et al. | ................. 257/458 |
| 2011/0041910 A1 | 2/2011 | Shimomura et al. | |

OTHER PUBLICATIONS

R. A. Sinton et al.; "27.5-Percent Silicon Concentrator Solar Cells"; IEEE Electron Device Letters; Oct. 1986; pp. 567-569; vol. EDL-7, No. 10.

* cited by examiner

*Primary Examiner* — Hoai V Pham
(74) *Attorney, Agent, or Firm* — Fish & Richardson P.C.

(57) ABSTRACT

An object is to provide a photoelectric conversion element with high conversion efficiency. In a photoelectric conversion element with a fine periodic structure on a light-receiving surface side, focus is given to the traveling direction of light that is reflected off another surface. The photoelectric conversion element may be given a structure in which a textured structure that reflects light to the other surface is provided, and light that travels from the light-receiving surface side to the other surface side is reflected so that a component that travels along the photoelectric conversion layer increases. By the distance traveled by the reflected light inside the photoelectric conversion layer increasing, the light that enters the photoelectric conversion element is more easily absorbed by the photoelectric conversion layer and less easily released from the light-receiving surface side, and a photoelectric conversion element with high conversion efficiency can be provided.

6 Claims, 8 Drawing Sheets

PHOTOELECTRIC CONVERSION ELEMENT

BACKGROUND OF THE INVENTION

1. Field of the Invention

The present invention relates to a photoelectric conversion element.

2. Description of the Related Art

Conversion efficiency of a photoelectric conversion element is reduced due to a variety of causes, and various countermeasures have been devised. For example, a back-contact structure in which a collection electrode is not formed over a light-receiving surface and has absolutely no shadow loss, has been suggested (for example, see Non-Patent Document 1). However, in the case of a photoelectric conversion element that receives light that has passed through the atmosphere, since a refractive index of the photoelectric conversion element is higher compared to the atmosphere, a portion of incident light is reflected at the light-receiving surface of the photoelectric conversion element. As a result, light that enters the element is reduced, and there occurs a phenomenon in which apparent conversion efficiency of the photoelectric conversion element is reduced.

In view of this, a technique is known in which an asperity structure (a so-called textured structure) with a longer period (pitch) than the wavelength of incident light is provided over a light-receiving surface of a photoelectric conversion element, and by one structure receiving light that is reflected by another structure, reduction of conversion efficiency is prevented.

Also, a phenomenon in which a portion of light that has entered inside the photoelectric conversion element is not absorbed by a photoelectric conversion layer and goes out of the element is also one cause for reduction in the conversion efficiency of the photoelectric conversion element. Specifically, there is a case in which a portion of light that has entered from the light-receiving surface of the photoelectric conversion element is not absorbed by the photoelectric conversion layer and is reflected by another surface and released from the light-receiving surface. This phenomenon occurs more conspicuously as the photoelectric conversion layer of the photoelectric conversion element becomes thinner.

In view of this, a method is known for forming a structure that easily absorbs light, by providing over a light-receiving surface of a photoelectric conversion element a textured structure with about the same period as a wavelength of incident light, to reduce a component of the light that travels toward another surface from the light-receiving surface in the shortest distance, and increase a component that travels inside the photoelectric conversion element.

On the other hand, a phenomenon is known in which it is difficult for light to be reflected off a surface of an object provided with a fine structure with a period that is sufficiently shorter than an incident light. As an example of such a fine periodic structure, a fine structure called a moth-eye structure is known, and is used in a reflection prevention film. Furthermore, there have been attempts at improving conversion efficiency by providing such a fine periodic structure over a light-receiving surface of a photoelectric conversion element.

REFERENCE

Non-Patent Document

Non-Patent Document 1

R. A. Sinton, Young Kwark, J. Y Gan, and Richard M. Swanson, "27.5-Percent Silicon Concentrator Solar Cells", IEEE Electron Device Lett., vol. EDL-7, No. 10, pp. 567-569, October 1986

SUMMARY OF THE INVENTION

In a photoelectric conversion element provided with a fine periodic structure over a light-receiving surface, reflection is controlled at the light-receiving surface and light easily enters the photoelectric conversion element. Accordingly, a structure in which a fine periodic structure is provided over a light-receiving surface of a photoelectric conversion element has an effect of improving photoelectric conversion efficiency.

However, since a period of the fine periodic structure provided over the light-receiving surface is about the same to about $1/10$ of a wavelength of light, light is not scattered and a portion of the light reaches another surface and is reflected there, and then returns to the fine periodic structure again. If the reflected light re-enters the fine periodic structure at this time at an angle in a range of 0° or more and less than 13° with respect to a direction that is perpendicular to the surface provided with the fine periodic structure, there is a problem that the reflected light passes through the fine periodic structure and goes outside of the photoelectric conversion element.

An embodiment of the present invention is made in view of the foregoing technical background. Therefore, an object of one embodiment of the present invention is to provide a photoelectric conversion element with high conversion efficiency.

To achieve the above object, in a photoelectric conversion element including a fine periodic structure over a light-receiving surface, one embodiment of the present invention focuses on a traveling direction of light that is reflected off another surface of the photoelectric conversion element.

Then, the above problem was solved by conceiving a structure in which the other surface is provided with a textured structure that reflects light that has traveled from the light-receiving surface to the other surface, towards a direction where a component that travels inside the photoelectric conversion layer increases.

That is, an embodiment of the present invention is a photoelectric conversion element including a photoelectric conversion layer, a fine periodic structure on a light-receiving surface side of the photoelectric conversion layer, a micro-texture structure over another surface of the photoelectric conversion layer, and a reflective electrode that is in contact with the micro-texture structure, wherein the fine periodic structure is provided with microstructures with an aspect ratio of 3 or more and 15 or less with a period of 60 nm or more and 500 nm or less; the micro-texture structure is provided with structures with an aspect ratio of 0.5 or more and 3 or less with a period of 2 µm or more and 100 µm or less, preferably 2 µm or more and 10 µm or less; and the reflective electrode has reflectivity of 10% or more and less than 100%.

According to the above-described embodiment of the present invention, in the photoelectric conversion element provided with the photoelectric conversion layer, a fine periodic structure is provided on a light-receiving surface side of the photoelectric conversion layer, and a micro-texture structure is provided on a surface side that is opposite the light-receiving surface of the photoelectric conversion layer (that is, the other surface of the photoelectric conversion layer). Furthermore, the reflective electrode with reflectivity of 10% or more and less than 100% is provided to be in contact with the micro-texture structure. With this, a portion of light that enters from a direction that is approximately perpendicular to the light-receiving surface is absorbed by the photoelectric conversion layer, and the rest travels a distance that is about a thickness of the photoelectric conversion layer and reaches the reflective electrode. The light that has reached the reflective electrode is reflected in a direction (specifically, a direction that proceeds along the photoelectric conversion layer) that is different from the direction of entrance (specifically, the direction that is approximately perpendicular to the light-receiving surface), by the reflective electrode that is provided in contact with the micro-texture structure. As a result, there is an effect that the distance that the reflected light travels inside the photoelectric conversion layer is increased. By the distance traveled by the reflected light inside the photoelectric conversion layer increasing, the light that enters the photoelectric conversion element is more easily absorbed by the photoelectric conversion element, and a photoelectric conversion element with high conversion efficiency can be provided.

Note that light that enters diagonally with respect to the light-receiving surface travels a distance inside the photoelectric conversion layer that is longer than the thickness of the photoelectric conversion layer, and is efficiently absorbed by the photoelectric conversion layer until it reaches the reflective electrode.

Furthermore, one embodiment of the present invention is a photoelectric conversion element in which among light that enters a photoelectric conversion layer, 10% or more and 99% or less of light with a light wavelength contributing to photoelectric conversion reaches the reflective electrode.

According to the above-described embodiment of the present invention, the photoelectric conversion layer efficiently absorbs light that travels through the photoelectric conversion layer. With this, light that has entered the photoelectric conversion element is more easily absorbed by the photoelectric conversion layer and less easily released from the light-receiving surface side, and a photoelectric conversion element with high conversion efficiency can be provided.

Furthermore, an embodiment of the present invention is a photoelectric conversion element in which a micro-texture structure has a surface that forms an angle of 8° or more and less than 45° or 49° or more and less than 90° with respect to a light-receiving surface of a photoelectric conversion layer.

According to the above-described embodiment of the present invention, a portion of light that has entered at an angle that is approximately perpendicular to the light-receiving surface of the photoelectric conversion layer passes through the photoelectric conversion layer, is reflected by the reflective electrode that is provided to be in contact with the micro-texture structure, and is incident on a fine periodic structure provided on the light-receiving surface side at an angle that satisfies a condition that allows for total reflection by the fine periodic structure. With this, light that enters at an angle that is approximately perpendicular to the light-receiving surface of the photoelectric conversion layer can be trapped in the photoelectric conversion layer, and a photoelectric conversion element with high conversion efficiency can be provided.

Furthermore, an embodiment of the present invention is a photoelectric conversion element in which a fine periodic structure is made of a semiconductor with one conductivity type; and a micro-texture structure is made of a semiconductor with a conductivity type that is opposite the one conductivity type.

According to the above-described embodiment of the present invention, the fine periodic structure and the micro-texture structure can be formed by a semiconductor microfabrication technique. With this, a photoelectric conversion element with high conversion efficiency can easily be provided.

Furthermore, an embodiment of the present invention is a photoelectric conversion element in which a photoelectric conversion layer contains a single crystal silicon substrate; and the micro-texture structure has a surface that is along a crystal orientation.

According to the above-described embodiment of the present invention, a photoelectric conversion layer with high efficiency can be formed using single crystal silicon, and a micro-texture structure that is along a crystal surface of the single crystal silicon can also be formed. With this, a photoelectric conversion element with high conversion efficiency can easily be provided.

Note that in this specification, a fine periodic structure refers to a structure that is provided with microstructures with an aspect ratio of 3 or more and 15 or less with a period of 60 nm or more and 500 nm or less, and a micro-texture structure refers to a structure that is provided with structures with an aspect ratio of 0.5 or more and 3 or less with a period of 2 μm or more and 100 μm or less, preferably 2 μm or more and 10 μm or less.

According to the present invention, a photoelectric conversion element with high conversion efficiency can be provided.

DETAILED DESCRIPTION OF THE INVENTION

Figure 1A:
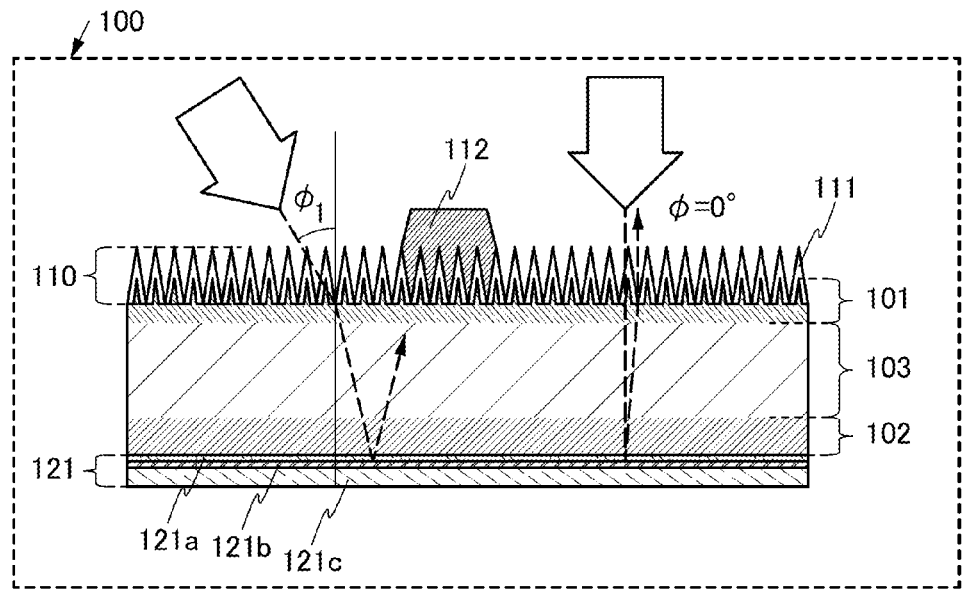
FIGS. 1A and 1B are each a diagram for explaining a structure of a photoelectric conversion element according to an embodiment.

Embodiments will be described in detail with reference to the drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

Embodiment 1

In this embodiment, a photoelectric conversion element including a photoelectric conversion layer, a fine periodic structure on a light-receiving surface side of the photoelectric conversion layer, a micro-texture structure on another surface side of the photoelectric conversion layer, and a reflective electrode that is in contact with the micro-texture structure, will be described with reference to FIGS. 1A and 1B. Specifically, a photoelectric conversion element will be described in which the fine periodic structure is provided with microstructures with an aspect ratio of 3 or more and 15 or less with a period of 60 nm or more and 500 nm or less, the microtexture structure is provided with structures with an aspect ratio of 0.5 or more and 3 or less with a period of 2 μm or more and 100 μm or less, preferably 2 μm or more and 10 μm or less, and the reflective electrode has reflectivity of 10% or more and less than 100%.

[Structure of Photoelectric Conversion Element]

A photoelectric conversion element 100 illustrated in FIG. 1A is provided with a photoelectric conversion layer 103, a first semiconductor layer 101 with one conductivity type on a light-receiving surface side of the photoelectric conversion layer 103, a first electrode 111 that is electrically connected to the first semiconductor layer 101, and a wiring 112. Also, a second semiconductor layer 102 with a conductivity type that is opposite the one conductivity type and a reflective electrode 121 are provided on another surface side of the photoelectric conversion layer 103. Furthermore, a fine periodic structure 110 is provided on the light-receiving surface side of the photoelectric conversion layer 103, and the reflective electrode 121 is provided in a manner that is in contact with the second semiconductor layer 102 as well as electrically connected thereto.

Figure 1B:
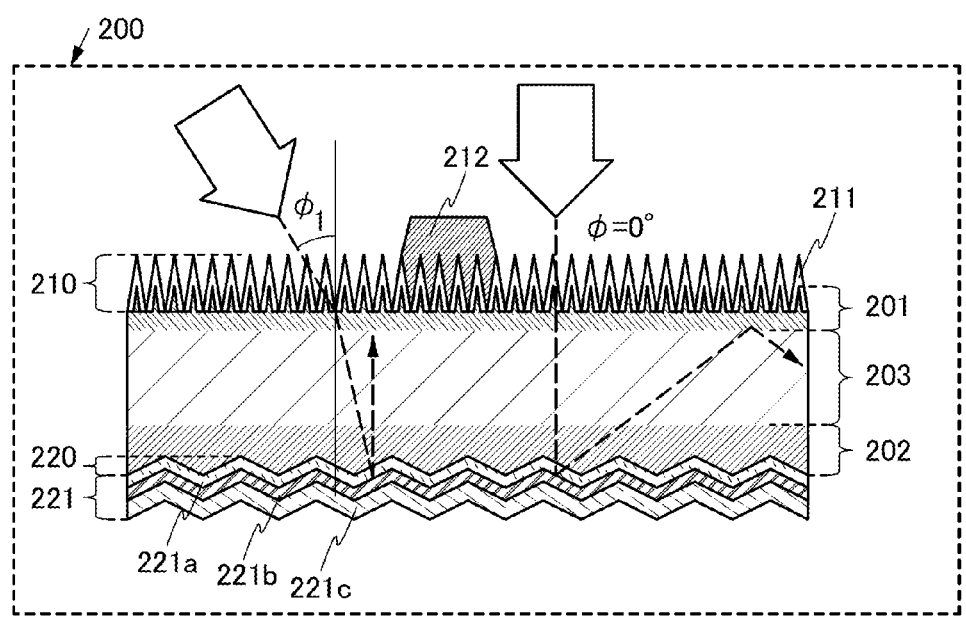

A photoelectric conversion element 200 illustrated in FIG. 1B is provided with a photoelectric conversion layer 203, a first semiconductor layer 201 with one conductivity type on a light-receiving surface side of the photoelectric conversion layer 203, a first electrode 211 that is electrically connected to the first semiconductor layer 201, and a wiring 212. Also, a second semiconductor layer 202 with a conductivity type that is opposite the one conductivity type and a reflective electrode 221 are provided on another surface side of the photoelectric conversion layer 203. Also, a fine periodic structure 210 is provided on the light-receiving surface side of the photoelectric conversion layer 203, and a micro-texture structure 220 is provided on the other surface side of the photoelectric conversion layer 203. Furthermore, the reflective electrode 221 is provided in a manner that is in contact with the micro-texture structure 220 and electrically connected to the second semiconductor layer 202.

Note that the reflective electrodes of the photoelectric conversion elements can be formed by stacking conductive films. The reflective electrode 121 of the photoelectric conversion element 100 illustrated as an example in this embodiment includes a conductive film 121a that has a light-transmitting property with respect to light that is absorbed by the photoelectric conversion layer 103 and has a large difference in refractive index with a conductive film 121b, the conductive film 121b that reflects light that is absorbed by the photoelectric conversion layer 103, and a conductive film 121c with low electrical resistance, which are stacked. Also, the reflective electrode 221 of the photoelectric conversion element 200 includes a conductive film 221a that has a light-transmitting property with respect to light that is absorbed by the photoelectric conversion layer 203 and has a large difference in refractive index with a conductive film 221b, the conductive film 221b that reflects light that is absorbed by the photoelectric conversion layer 203, and a conductive film 221c with low electrical resistance, which are stacked.

Using the photoelectric conversion element 200 as an example, a reason for having a structure of providing the conductive film 221a with a light-transmitting property between the conductive film 221b that reflects light and the photoelectric conversion layer 203 will be described. Depending on a material of the photoelectric conversion layer 203, there are cases in which even if the conductive film 221b with reflectivity is made to be in direct contact with the photoelectric conversion layer 203, a difference between the refractive indices of the photoelectric conversion layer 203 and the conductive film 221b is not obtained with respect to light that is absorbed by the photoelectric conversion layer 203, and favorable reflectivity is not obtained. In such cases, by providing therebetween the conductive film 221a which has a large refractive index difference with the conductive film 221b and has a light-transmitting property with respect to light that is absorbed by the photoelectric conversion layer 203, favorable reflectivity can be obtained at an interface between the conductive film 221a and the conductive film 221b. As a result, there is an effect of increasing an amount of light that enters the photoelectric conversion layer.

Note that in the photoelectric conversion element 100, electrical power generated in the photoelectric conversion layer 103 is output to the first electrode 111 and the reflective electrode 121, and in the photoelectric conversion element 200, electrical power generated in the photoelectric conversion layer 203 is output to the first electrode 211 and the reflective electrode 221.

[Synergetic Effect of Fine Periodic Structure and Micro-Texture Structure]

The photoelectric conversion element 100 and the photoelectric conversion element 200 are each provided with microstructures with an aspect ratio of 3 or more and 15 or less with a period of 60 nm or more and 500 nm or less, on a light-receiving surface side. Also, the fine periodic structure is formed of a material with a higher refractive index than the air. By having such a structure of providing the fine periodic structure on a light-receiving surface side, light that enters the light-receiving surface from outside of the photoelectric conversion element from the light-receiving surface side becomes unable to fulfill a condition for total reflection. As a result, there is an effect of increasing the amount of light that enters the photoelectric conversion layer.

For example, in the photoelectric conversion element 100 as shown in FIG. 1A, light that is incident at an angle $\phi_1$ with respect to the light-receiving surface is not totally reflected on the light-receiving surface side and enters the photoelectric conversion layer 103 because the fine periodic structure 110 is provided on the light-receiving surface side. Also, since the light that enters at the angle $\phi_1$ contains a component that travels along the photoelectric conversion layer 103, the light travels a distance that is longer than the thickness of the photoelectric conversion layer and is absorbed by the photoelectric conversion layer.

In the same manner, in the photoelectric conversion element 200 as shown in FIG. 1B, light that is incident at an angle $\phi_1$ with respect to the light-receiving surface is not totally reflected on the light-receiving surface side and enters the photoelectric conversion layer 203 because the fine periodic structure 210 is provided on the light-receiving surface side. Also, since the light that enters at the angle $\phi_1$ contains a component that travels along the photoelectric conversion layer 203, the light travels a distance that is longer than the thickness of the photoelectric conversion layer and is absorbed by the photoelectric conversion layer.

Furthermore, light that enters at an approximate perpendicular angle ($\phi=0°$) with respect to the light-receiving surface will be described. In the photoelectric conversion element 100, light that enters from the light-receiving surface reaches the reflective electrode 121 just by traveling a distance that is about the thickness of the photoelectric conversion layer 103, and in the photoelectric conversion element 200 also, light reaches the reflective electrode 221 just by traveling a distance that is about the thickness of the photoelectric conversion layer 203.

In the case of the photoelectric conversion element 100, the reflective electrode 121 is approximately parallel to the light-receiving surface. As a result, light that is reflected by the reflective electrode 121 reaches the light-receiving surface just by traveling again a distance that is about the same as the thickness of the photoelectric conversion layer. Accordingly, the photoelectric conversion layer 103 cannot absorb a portion of light that enters at an approximately perpendicular angle to the light-receiving surface, and releases it outside of the photoelectric conversion element 100 from the light-receiving surface.

On the other hand, in the case of the photoelectric conversion element 200, the reflective electrode 221 is provided to be in contact with the micro-texture structure 220 and the reflective electrode 221 is not parallel to the light-receiving surface. Accordingly, light that is reflected by the reflective electrode 221 travels in a direction (a direction that contains a component that is along the photoelectric conversion layer 203) that is different from an entrance direction (specifically, a direction from which the light has entered the light-receiving surface at an approximately perpendicular angle). As a result, the distance that the reflected light travels inside the photoelectric conversion layer 203 is increased, light that enters the photoelectric conversion element 200 is more easily absorbed by the photoelectric conversion layer and less easily released from the light-receiving surface side, and there is an effect of increasing conversion efficiency.

Figure 2A:
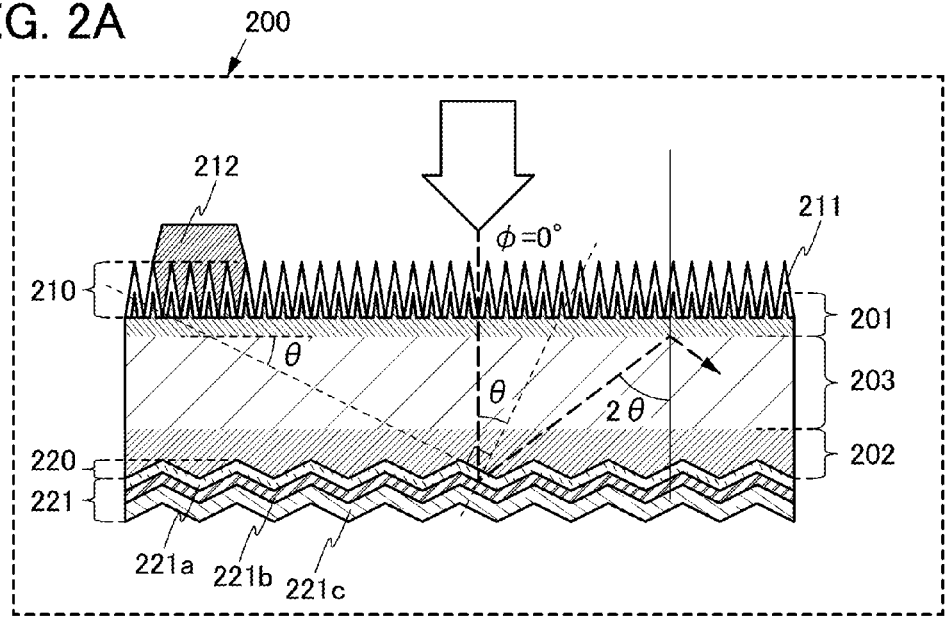
FIGS. 2A to 2C are each a diagram for explaining a structure of a photoelectric conversion element according to an embodiment.
Figure 2B:
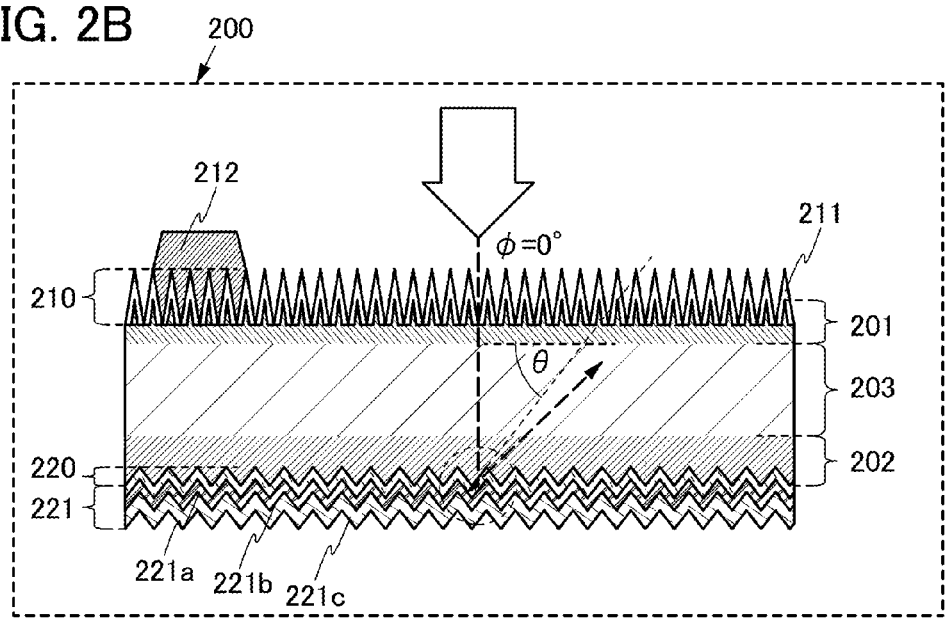
Figure 2C:
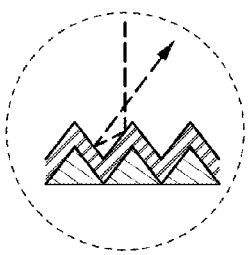

In particular, the micro-texture structure 220 preferably has a structure of having a surface that forms an angle of 8° or more and less than 45° or 49° or more and less than 90° with respect to the light-receiving surface of the photoelectric conversion layer 203. This is so that the reflective electrode, which is provided to be in contact with the surface that forms an angle of 8° or more and less than 45° or 49° or more and less than 90° with respect to the light-receiving surface of the photoelectric conversion layer 203, reflects light that has entered at an approximately perpendicular angle to the light-receiving surface of the photoelectric conversion layer 203 towards a fine periodic structure so that the light is incident at an angle that satisfies a condition that allows for total reflection by the fine periodic structure. FIGS. 2A to 2C each illustrate a relationship between an angle θ formed by a surface provided for the micro-texture structure (also may be described as a surface forming a microstructure) with respect to the light-receiving surface of the photoelectric conversion layer 203, and an angle at which light is incident on the fine periodic structure. Light that is shown by an arrow enters from a direction that is perpendicular to the light-receiving surface of the photoelectric conversion layer 203 and is reflected by the surface provided for the micro-texture structure 220. Light that is incident on the fine periodic structure 210 from the photoelectric conversion layer 203 forms an angle 2θ with respect to a direction that is perpendicular to the light-receiving surface. Note that since the condition for total reflection is satisfied as long as 2θ is 15° or more, it is acceptable as long as the angle θ that is formed by the surface provided for the micro-texture structure with respect to the light-receiving surface of the photoelectric conversion layer 203 is 8° or more and less than 45°, or 49° or more and less than 90°. With this, light that enters the light-receiving surface of the photoelectric conversion layer at an approximately perpendicular angle can be trapped in the photoelectric conversion layer, and a photoelectric conversion element with high conversion efficiency can be provided.

Note that the reflective electrode, which is provided to be in contact with the surface that forms an angle of 8° or more and less than 45° with respect to the light-receiving surface of the photoelectric conversion layer 203, reflects light that has entered at an approximately perpendicular angle to the light-receiving surface of the photoelectric conversion layer 203 towards a fine periodic structure as shown in FIG. 2A through a single reflection so that a condition that allows for total reflection by the fine periodic structure is satisfied. It is particularly preferable to have a small number of reflections at the reflective electrode, since the lesser the number of reflections, the more light loss that can be prevented at the reflective electrode.

Furthermore, when the angle θ formed by the surface provided for the micro-texture structure with respect to the light-receiving surface of the photoelectric conversion layer 203 is 49° or more and less than 90°, light enters the photoelectric conversion layer after repeating reflection a plurality of times at the reflective electrode as shown in FIGS. 2B and 2C. Also, if incident light tilts with respect to the perpendicular direction of the light-receiving surface, the distance that is traveled by the light through the photoelectric conversion layer 203 to reach the micro-texture structure 220 is increased, and the light is more easily absorbed by the photoelectric conversion layer.

Note that the photoelectric conversion layer provided in the photoelectric conversion element is not particularly limited as long as it has a photoelectric effect. As a structure using an inorganic system material, a photoelectric conversion layer using a Group IV semiconductor, a photoelectric conversion layer using a compound semiconductor (Group III-V, Group II-VI, Group I-III-VI, or the like), or the like can be given as an example, and as a structure using an organic system, a photoelectric conversion layer using an organic semiconductor, a dye-sensitized photoelectric conversion layer, or the like can be given as an example. Furthermore, a hybrid-type photoelectric conversion layer that combines an inorganic system material and an organic system material can also be used.

Typically, a silicon-based photoelectric conversion layer of amorphous silicon, microcrystalline silicon, polycrystalline silicon, single crystal silicon, or the like can be given. Alternatively, a compound semiconductor photoelectric conversion layer using gallium arsenide, copper indium sulfide, or the like, an organic semiconductor photoelectric conversion layer using phthalocyanine, fullerene, or the like, or a dye-sensitized photoelectric conversion layer using titanium oxide or the like can be used.

Moreover, a tandem structure or a stacked structure in which a plurality of the above-described photoelectric conversion layers are stacked can also be used.

As a photoelectric conversion element described as an example in this embodiment, a photoelectric conversion element using a single crystal silicon substrate is preferable. This is because by having a structure in which single crystal silicon is used, a high efficiency photoelectric conversion layer can be formed, and a micro-texture structure that is along a crystal surface of the single crystal silicon can easily be formed.

By application of a structure described in the example of this embodiment which includes the photoelectric conversion layer, the fine periodic structure on the light-receiving surface side of the photoelectric conversion layer, the micro-texture structure on the other surface side of the photoelectric conversion layer, and the reflective electrode that is in contact with the micro-texture structure, a photoelectric conversion element with high conversion efficiency can be provided.

Note that this embodiment can be freely combined with any of the other embodiments in this specification.

Embodiment 2

Figure 3A:
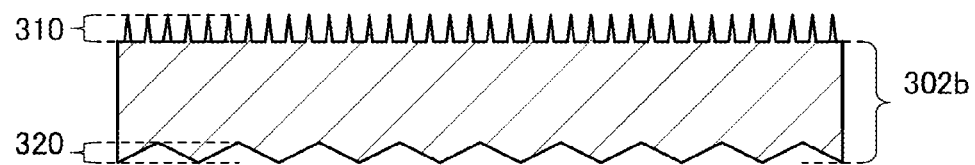
FIGS. 3A to 3C are diagrams for explaining a manufacturing method of a photoelectric conversion element according to an embodiment.
Figure 3B:
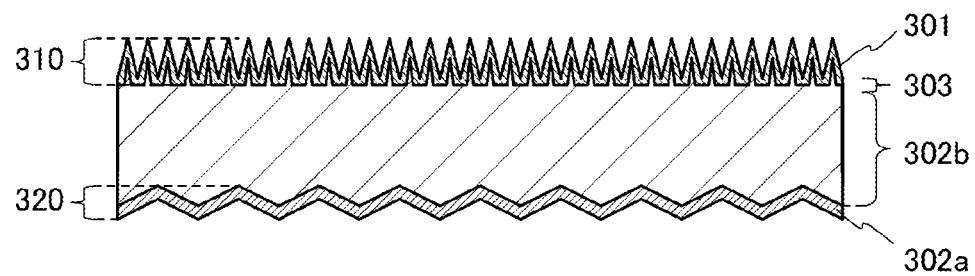
Figure 3C:
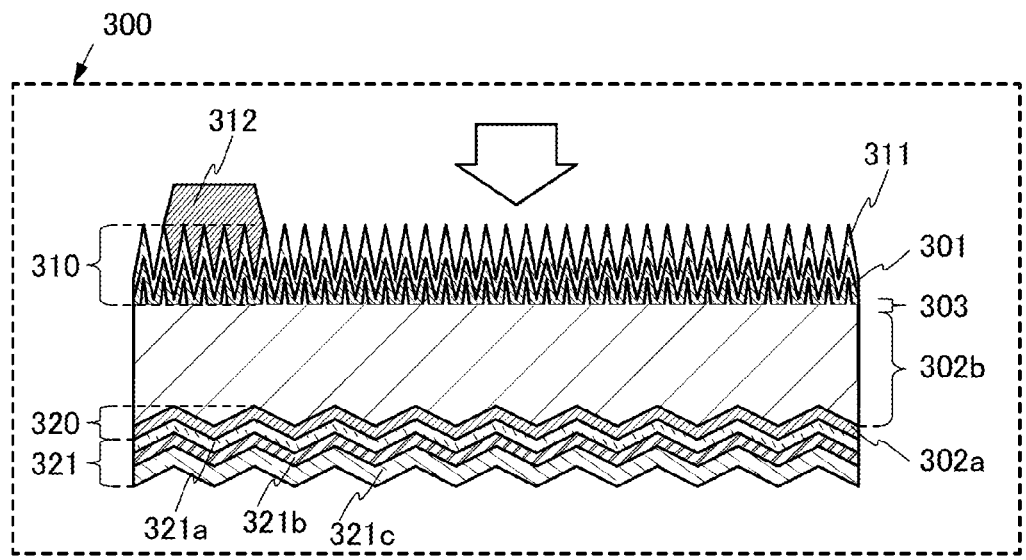

In this embodiment, a structure and manufacturing method of a photoelectric conversion element using a single crystal semiconductor substrate and including a photoelectric conversion layer, a fine periodic structure on a light-receiving surface side of the photoelectric conversion layer, a micro-texture structure on another surface side of the photoelectric conversion layer, and a reflective electrode that is in contact with the micro-texture structure, are described with reference to FIGS. 3A to 3C. Furthermore, a modified example thereof will be described with reference to FIGS. 4A to 4C.

A structure of a photoelectric conversion element given as an example in this embodiment is illustrated in FIG. 3C. A photoelectric conversion element 300 includes a third semiconductor layer 302b made of an n-type single crystal silicon substrate. The third semiconductor layer 302b is provided with a first semiconductor layer 301 made of p-type amorphous silicon on a light-receiving surface side, a first electrode 311 that is electrically connected to the first semiconductor layer 301, and a wiring 312. Also, on another surface side of the third semiconductor layer 302b, a second semiconductor layer 302a made of n+ type amorphous silicon, and a reflective electrode 321, are provided. Furthermore, a fine periodic structure 310 is provided on the light-receiving surface side of the third semiconductor layer 302b, and a micro-texture structure 320 is provided on the other surface side of the third semiconductor layer 302b. Also, the reflective electrode 321 is provided in a manner that is in contact with the micro-texture structure 320 and electrically connected to the second semiconductor layer 302a. Note that in such a structure, a depletion layer that is formed at an interface at which the third semiconductor layer 302b made of an n-type single crystal silicon substrate comes in contact with the first semiconductor layer 301 made of p-type amorphous silicon serves as a photoelectric conversion layer.

[Single Crystal Semiconductor Substrate]

The photoelectric conversion element of this embodiment is provided with a single crystal semiconductor substrate. The single crystal semiconductor substrate is not particularly limited as long as a photoelectric conversion layer can be formed, and for example, a single crystal substrate made of a Group IV semiconductor, a single crystal substrate made of a compound semiconductor (Group III-V, Group II-VI, Group I-III-VI, or the like), or the like can be given. Also, conductivity type of the single crystal substrate is not particularly limited, and may be n-type or p-type.

In this embodiment, a case of forming a photoelectric conversion element using an n-type single crystal silicon substrate will be described. Note that in the case of using a single crystal silicon substrate, it is preferably a substrate provided with a (100) plane on a surface of the substrate. This is so that the micro-texture structure can easily be formed by a method that is described below. The single crystal silicon substrate provided with a (100) plane on a surface thereof can be manufactured by cutting it out of a single crystal that is manufactured using a known method such as a MCZ method. Note that a single crystal silicon substrate with a volume resistivity of 1 Ω·cm or more and 5 Ω·cm or less can be used, for example.

[Formation Method of Fine Periodic Structure]

A silicon substrate over which a resist mask is formed is etched to form a fine periodic structure on a surface thereof. As the resist mask, monodispersed silicon oxide particles each with a diameter of 60 nm or more and 500 nm or less are arranged over the surface of the single crystal silicon substrate. As a method of arranging the silicon oxide particles, the silicon substrate is dipped in a slurry made of silicon oxide particles dispersed in pure water or the like, and the silicon substrate is then taken out at a slow speed of about 10 µm/sec from the slurry.

Next, anisotropic etching is performed on the single crystal silicon substrate over which the silicon oxide particles are arranged. For example, etching is performed by a dry etching method using carbon tetrafluoride gas to which oxygen is added. Specifically, carbon tetrafluoride gas ($CF_4$) and oxygen ($O_2$) are introduced to a dry etching apparatus at a flow ratio of $CF_4:O_2=85$ sccm:15 sccm, and etching is performed with electrical power of 100 W.

By the arranged silicon oxide particles serving as a resist mask, etching can be carried out so that the silicon substrate of a portion that is in contact with the silicon oxide particles is left behind in a column shape. With this method, by appropriately adjusting the diameter of the silicon oxide particles and an etching condition, microstructures with an aspect ratio of 3 or more and 15 or less can be formed over the surface of the substrate with a period of 60 nm or more and 500 nm or less. The silicon oxide particles used as the resist mask is removed by etching, and the fine periodic structure is completed.

Also, the manufacturing method of the fine periodic structure is not limited thereto, and a laser with an extremely short pulse in the femtoseconds, picoseconds, or the like can be used. Specifically, by emitting a laser with a defocused, extremely short pulse on the silicon substrate, a fine periodic structure can be formed over the substrate.

[Formation Method of Micro-Texture]

Next, a micro-texture is formed over another surface of the silicon substrate over which the fine periodic structure is formed. Note that before starting a formation step of the micro-texture, a resist polymer is applied to the fine periodic structure that is manufactured to protect the fine periodic structure during the formation step of the micro-texture.

In this embodiment, the micro-texture is formed by utilizing a characteristic that an etching speed of the single crystal silicon is different over a crystal surface. Specifically, when a silicon substrate provided with a (100) plane on a surface thereof is etched using an alkaline solution, pyramid-shaped structures with an aspect ratio of 0.5 or more and 3 or less can be formed with a period of 2 µm or more and 100 µm or less, preferably 2 µm or more and 10 µm or less. By having a period of 2 µm or more, light with a light wavelength contributing to photoelectric conversion can sufficiently recognize an angle of a surface forming the micro-texture, and can be reflected at an angle according to a law of reflection. Furthermore, by having a period of 10 µm or less, not only the manufacturing of the micro-texture becomes easy because etching amount is suppressed, strength of the single crystal silicon substrate can also be maintained. Note that the above-described pyramid-shaped structures each have a surface that forms approximately a 55° angle with respect to the light-receiving surface of the photoelectric conversion layer.

After the micro-texture structure 320 is formed, the resist polymer for protecting the fine periodic structure is removed. A structure of the n-type single crystal silicon substrate at this point is illustrated in FIG. 3A. The n-type single crystal silicon substrate corresponds to the third semiconductor layer 302b, and the fine periodic structure 310 is formed over the surface of the third semiconductor layer 302b and the micro-texture structure 320 is formed over the other surface.

[Formation Method of p-n Junction]

Next, over the surface of the third semiconductor layer 302b over which the fine periodic structure 310 is formed, a p-type amorphous silicon semiconductor layer is formed as the first semiconductor layer 301. For the first semiconductor layer 301, a film with a thickness of about 10 nm formed by a CVD method can be used, for example.

By providing the first semiconductor layer 301 made of a p-type amorphous silicon semiconductor so as to be in contact with the third semiconductor layer 302b, a p-n junction is formed. A depletion layer that is formed at an interface at which the third semiconductor layer 302b comes in contact with the first semiconductor layer 301 serves as a photoelectric conversion layer 303.

Note that before forming the first semiconductor layer 301, a passivation layer made of an i-type amorphous silicon layer may be formed over a surface of the third semiconductor layer 302b over which the fine periodic structure 310 is formed. A dangling bond that is at the surface of the third semiconductor layer 302b made of a single crystal silicon substrate can be terminated by hydrogen contained in the i-type amorphous silicon layer. A thickness of the passivation film may be about 5 nm to 10 nm.

[Formation Method of BSF Layer]

Next, over a surface of the third semiconductor layer 302b over which the micro-texture structure 320 is formed, an n-type amorphous silicon semiconductor layer is formed as the second semiconductor layer 302a. For the second semiconductor layer 302a, a film with a thickness of about 10 nm formed by a CVD method can be used, for example. The second semiconductor layer 302a serves as a Back Surface Field (BSF) layer, and can control electric field distribution in rear surface junction. A structure at this point is illustrated in FIG. 3B.

Note that before forming the second semiconductor layer 302a, a passivation layer made of an i-type amorphous silicon layer may be formed over a surface of the third semiconductor layer 302b over which the micro-texture structure 320 is formed. A thickness of the passivation film may be about 5 nm to 10 nm.

[Formation Method of Reflective Electrode]

Next, the reflective electrode 321 is formed in contact with the second semiconductor layer 302a. The reflective electrode 321 given as an example in this embodiment includes a conductive film 321a that has a light-transmitting property with respect to light that is absorbed by the photoelectric conversion layer 303 and has a large difference in refractive index with a conductive film 321b, the conductive film 321b that reflects light that is absorbed by the photoelectric conversion layer 303, and a conductive film 321c with low electrical resistance, which are stacked. As a conductive film for forming the conductive film 321a with a light-transmitting property, a conductive film containing any one of indium tin oxide, tin oxide, and zinc oxide, or the like can be used, for example. Also, a conductive film for forming the conductive film 321b is preferably a conductive film with high reflectivity, and a conductive film containing silver (Ag), aluminum (Al), or the like is preferable, for example. Furthermore, as a conductive film for forming the conductive film 321c, an inexpensive conductive film with high conductivity is preferable, and a conductive film containing aluminum (Al) or the like can be used, for example. Note that the reflective electrode 321 may just be a conductive film for reflecting light that is absorbed by the photoelectric conversion layer 303.

[Formation Method of First Electrode and Wiring]

Next, the first electrode 311 is formed in contact with the first semiconductor layer 301. The first electrode 311 is formed using a conductive film that has a light-transmitting property with respect to light that is absorbed by the photoelectric conversion layer 303. For example, a conductive film containing one of indium tin oxide, tin oxide, and zinc oxide, or the like can be used.

Next, the wiring 312 that is electrically connected to the first electrode 311 is formed. Although a method of selectively forming the wiring 312 is not particularly limited, a printing method is favorable since it is inexpensive. As a wiring formation method using a printing method, a method of applying an ink containing fine particles of silver using a dispenser or an inkjet, or a method of screen printing can be given as an example.

By using the above method, the photoelectric conversion element 300 illustrated as an example in FIG. 3C can be formed.

Modification Example

A structure of a photoelectric conversion element that is a modification example of this embodiment and a manufacturing method thereof will be described with reference to FIGS. 4A to 4C. A structure of a photoelectric conversion element 400 that is a modification example of this embodiment is illustrated in FIG. 4C. The photoelectric conversion element 400 illustrated in FIG. 4C and the photoelectric conversion element 300 illustrated in FIG. 3C have different structures of fine periodic structure and manufacturing methods thereof. Here, the structure and manufacturing method of the fine periodic structure in the photoelectric conversion element 400 will be mainly explained, and for other portions that can be formed using the same material, method, and condition as the photoelectric conversion element 300, description of the photoelectric conversion element 300 will be referenced.

A structure of a photoelectric conversion element that is a modification example of this embodiment is illustrated in FIG. 4C. A photoelectric conversion element 400 includes a third semiconductor layer 402b made of an n-type single crystal silicon substrate. The third semiconductor layer 402b is provided with a first semiconductor layer 401 made of p-type amorphous silicon on a light-receiving surface side, a first electrode 411 that is electrically connected to the first semiconductor layer 401, and a wiring 412. Also, on another surface side of the third semiconductor layer 402b, a second semiconductor layer 402a made of n+ type amorphous silicon, and a reflective electrode 421, are provided. Furthermore, a fine periodic structure 410 is provided to be in contact with the first electrode 411, and a micro-texture structure 420 is provided on the other surface side of the third semiconductor layer 402b. Also, the reflective electrode 421 is provided in a manner that is in contact with the micro-texture structure 420 and electrically connected to the second semiconductor layer 402a. Note that in such a structure, a depletion layer that is formed at an interface at which the third semiconductor layer 402b made of an n-type single crystal silicon substrate comes in contact with the first semiconductor layer 401 made of p-type amorphous silicon serves as a photoelectric conversion layer.

[Formation Method of Micro-Texture of Modification Example]

The photoelectric conversion element 400 can be manufactured using the same semiconductor substrate as the photoelectric conversion element 300. Here, a case of using a single crystal silicon substrate will be described. Note that unlike the manufacturing method of the photoelectric conversion element 300, a microstructure is not formed over one surface of a semiconductor substrate used in the photoelectric conversion element 400. Furthermore, although a microstructure may be formed on both surfaces of the silicon substrate, in the case of forming a micro-structure just on another surface side, a resist polymer may be applied to the one surface so as to protect the one surface.

A micro-texture is formed over the other surface of the silicon substrate. In the same manner as the semiconductor substrate used in the photoelectric conversion element 300, pyramid-shaped structures with an aspect ratio of 0.5 or more and 3 or less are formed with a period of 2 μm or more and 100 μm or less, preferably 2 μm or more and 10 μm or less. Note that the resist polymer for protecting the one surface of the semiconductor substrate is removed after the micro-texture structure 420 is formed.

Figure 4A:
FIGS. 4A to 4C are diagrams for explaining a manufacturing method of a photoelectric conversion element according to an embodiment.
Figure 4B:
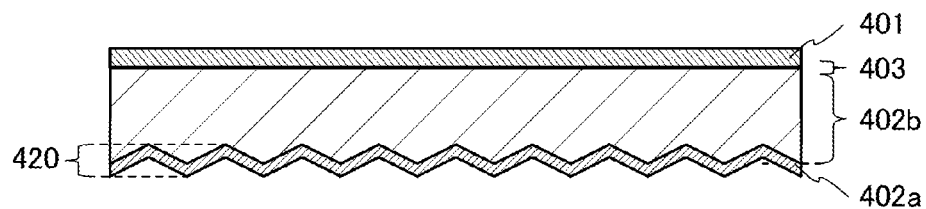
Figure 4C:
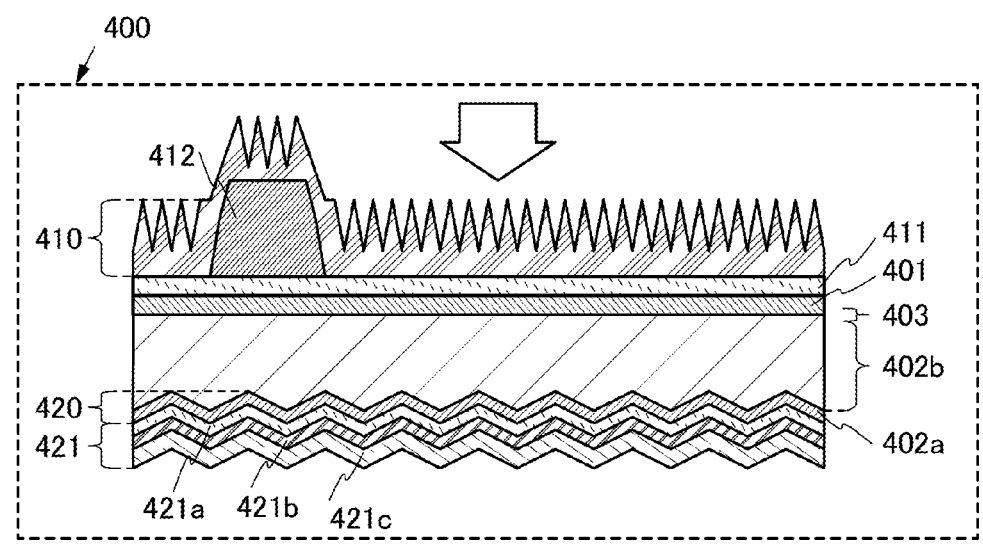

A structure of an n-type single crystal silicon substrate at this point is illustrated in FIG. 4A. The n-type single crystal silicon substrate corresponds to the third semiconductor layer 402b, and the micro-texture structure 420 is formed over the other surface of the third semiconductor layer 402b.

[Formation Method of p-n Junction of Modification Example]

Next, over the one surface of the third semiconductor layer 402b, a p-type amorphous silicon semiconductor layer is formed as the first semiconductor layer 401. The first semiconductor layer 401 may be formed using the same method as the first semiconductor layer 301 of the photoelectric conversion element 300.

By providing the first semiconductor layer 401 made of a p-type amorphous silicon semiconductor to be in contact with the third semiconductor layer 402b, a p-n junction is formed. A depletion layer that is formed at an interface at which the third semiconductor layer 402b and the first semiconductor layer 401 come in contact serves as a photoelectric conversion layer 403.

[Formation Method of BSF Layer of Modification Example]

Next, over a surface of the third semiconductor layer 402b over which the micro-texture structure 420 is formed, an n-type amorphous silicon semiconductor layer is formed as the second semiconductor layer 402a. The second semiconductor layer 402a may be formed by the same method as the second semiconductor layer 302a of the photoelectric conversion element 300. The second semiconductor layer 402a serves as a BSF layer. A structure at this point is illustrated in FIG. 4B.

[Formation Method of Reflective Electrode of Modification Example]

Next, the reflective electrode 421 is formed in contact with the second semiconductor layer 402a. The reflective electrode 421 may be formed by the same method as the reflective electrode 321 of the photoelectric conversion element 300.

[Formation Method of First Electrode and Wiring of Modification Example]

Next, the first electrode 411 is formed in contact with the first semiconductor layer 401, and the wiring 412 that is electrically connected to the first electrode 411 is formed. The first electrode 411 may be formed by the same method as the first electrode 311 of the photoelectric conversion element 300, and the wiring 412 may be formed by the same method as the wiring 312 of the photoelectric conversion element 300.

[Formation Method of Fine Periodic Structure of Modification Example]

Next, the fine periodic structure 410 is formed in contact with the first electrode 411. The fine periodic structure 410 may be formed by attaching over the first electrode 411 a film over which a fine periodic structure is formed in advance, using an adhesive agent. Note that as a method of forming the fine periodic structure over the film, a method of manufacturing an original plate using a resist mask formed by using an electron beam or ultraviolet light and then molding a thermoplastic resin, a photo-curing resin, or the like using the original plate, that is, a so-called nanoimprinting method can be used.

Using the above method, the photoelectric conversion element 400 illustrated in FIG. 4C can be formed.

According to the method described in this embodiment, a photoelectric conversion element with high conversion efficiency can be provided, which has a structure including the photoelectric conversion layer, the fine periodic structure on the light-receiving surface side of the photoelectric conversion layer, the micro-texture structure on the other surface side of the photoelectric conversion layer, and the reflective electrode that is in contact with the micro-texture structure.

Note that this embodiment can be freely combined with any of the other embodiments in this specification.

Embodiment 3

In this embodiment, a structure and manufacturing method of a photoelectric conversion element including a photoelectric conversion layer, a fine periodic structure on a light-receiving surface side of the photoelectric conversion layer, a micro-texture structure on another surface side of the photoelectric conversion layer, and a reflective electrode that is in contact with the micro-texture structure, are described with reference to FIGS. 5A to 5D. Furthermore, a modification example thereof will also be described with reference to FIGS. 6A to 6D.

Figure 5A:
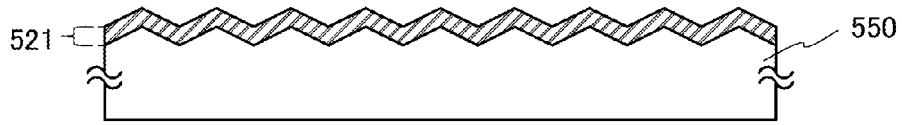
FIGS. 5A to 5D are diagrams for explaining a manufacturing method of a photoelectric conversion element according to an embodiment.
Figure 5B:
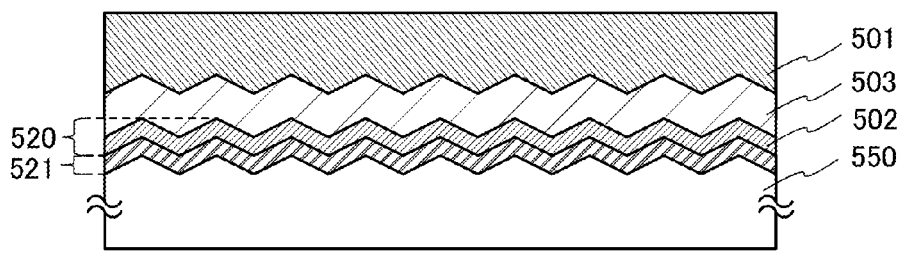
Figure 5C:
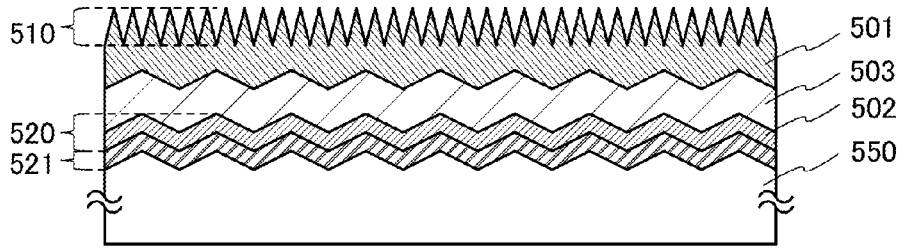
Figure 5D:
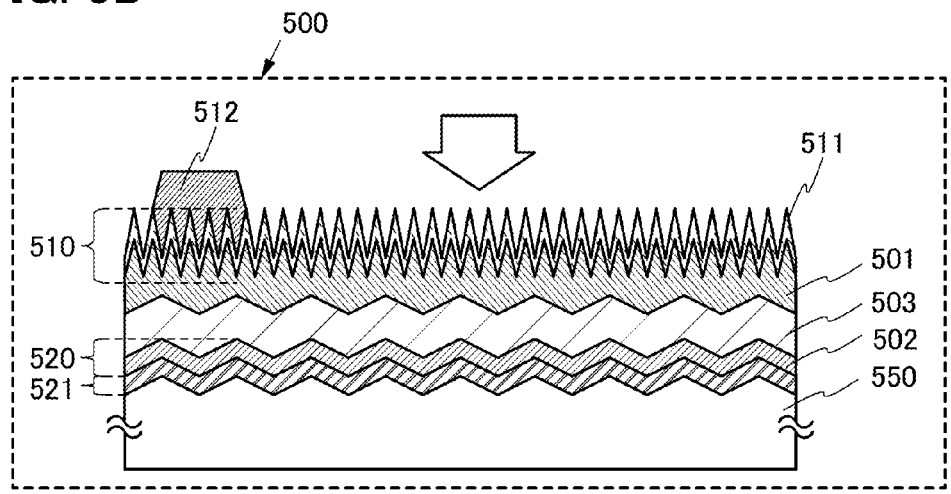

A structure of a photoelectric conversion element given as an example in this embodiment is illustrated in FIG. 5D. A photoelectric conversion element 500 includes a photoelectric conversion layer 503 made of amorphous silicon. The photoelectric conversion layer 503 is provided with a first semiconductor layer 501 made of amorphous silicon with one conductivity type on a light-receiving surface side, a first electrode 511 that is electrically connected to the first semiconductor layer 501, and a wiring 512. Also, on another surface side of the photoelectric conversion layer 503, a second semiconductor layer 502 made of amorphous silicon with a conductivity type that is opposite the one conductivity type, and a reflective electrode 521 are provided. Furthermore, a fine periodic structure 510 is provided on the light-receiving surface side of the photoelectric conversion layer 503, and a micro-texture structure 520 is provided on the other surface side of the photoelectric conversion layer 503. Also, the reflective electrode 521 is provided in a manner that is in contact with the micro-texture structure and electrically connected to the second semiconductor layer 502.

[Substrate]

The photoelectric conversion element of this embodiment is formed over a substrate 550. The substrate 550 is not particularly limited as long as it has heat resistance against heat that is applied during a manufacturing process of the photoelectric conversion element; mechanical strength that can support the photoelectric conversion element; dimension stability; and a barrier property that can suppress diffusion of an impurity that degrades reliability of the photoelectric conversion element. Also, the substrate 550 may either have a light-transmitting property with respect to light that is absorbed by the photoelectric conversion layer 503 or not have a light-transmitting property with respect to light that is absorbed by the photoelectric conversion layer 503. Furthermore, a surface may have an insulating property or a conductive property.

As a specific example of a material for the substrate 550, the following can be given: plastic, soda glass, alkali-free glass, metal, or the like, or a lamination of a plurality of materials selected from the materials. Note that in this embodiment, soda glass is used for the substrate 550.

[Formation Method of Structure Serving as Matrix of Micro-Texture]

Over one surface of the substrate 550, a structure that serves as a matrix of a micro-texture is formed. As a method of forming the structure serving as the matrix, a method of ablating a surface by laser irradiation; an etching method by forming a resist mask over the substrate; a method of sand-blasting the substrate; or the like can be given. In this embodiment, the structure serving as the matrix is formed over the substrate 550 by a sand-blasting method.

[Formation Method of Reflective Electrode]

Next, the reflective electrode 521 is formed by forming a conductive film over the structure serving as the matrix of the micro-texture. For the reflective electrode 521, a material with a conductive property that reflects light that is absorbed by the photoelectric conversion layer 503 is used. In particular, a material with low electrical resistance and high reflectivity is preferable, such as a conductive film containing silver (Ag), aluminum (Al), or the like, for example. In this embodiment, a conductive film made of an alloy formed by adding silicon (Si) to aluminum (Al) that has a thickness of 300 nm is used for the reflective electrode. Also, the reflective electrode 521 may be formed into an island shape or the like as necessary by using a resist mask or the like. Note that a structure at this point is illustrated in FIG. 5A.

[Formation Method of Micro-Structure and pin Structure]

Next, the second semiconductor layer 502 made of an n-type amorphous silicon semiconductor is formed over the reflective electrode 521, and the photoelectric conversion layer 503 made of an i-type amorphous silicon semiconductor is formed over the second semiconductor layer 502. In this embodiment, an n-type amorphous silicon semiconductor layer with a thickness of 10 nm is formed as the second semiconductor layer 502, and an i-type amorphous silicon semiconductor layer with a thickness of 200 nm or more and 400 nm or less, for example, is formed as the photoelectric conversion layer 503.

Since the structure serving as the matrix of the micro-texture is formed over the substrate 550, a micro-texture is formed on a side of the photoelectric conversion layer 503 that is in contact with the second semiconductor layer 502, which has structures with an aspect ratio of 0.5 or more and 3 or less with a period of 2 µm or more and 100 µm or less, preferably 2 µm or more and 10 µm or less.

The first semiconductor layer 501 made of a p-type amorphous silicon semiconductor is formed over the photoelectric conversion layer 503. Since a portion of the first semiconductor layer 501 is processed in a later step to form a fine periodic structure, the first semiconductor layer 501 is formed with a thickness of 0.1 µm or more and 5 µm or less, for example a thickness of 1 µm. A structure at this point is illustrated in FIG. 5B.

Note that by providing the i-type photoelectric conversion layer 503 between the n-type second semiconductor layer 502 and the p-type first semiconductor layer 501, a pin structure is formed.

[Formation Method of Fine Periodic Structure]

Next, a fine periodic structure is formed over a surface of the first semiconductor layer 501. The fine periodic structure can be formed by the method described in Embodiment 2. Specifically, the fine periodic structure can be formed by anisotropic dry etching, using a resist mask that is formed by arranging monodispersed silicon oxide particles. Alternatively, the fine periodic structure may be formed by using a laser with an extremely short pulse. A structure at this point is illustrated in FIG. 5C.

[Formation Method of First Electrode and Wiring]

Next, the first electrode 511 is formed in contact with the first semiconductor layer 501. The first electrode 511 is formed using a conductive film that has a light-transmitting property with respect to light that is absorbed by the photoelectric conversion layer 503. For example, a conductive film containing one of indium tin oxide, tin oxide, and zinc oxide, or the like can be used.

Next, the wiring 512 that is electrically connected to the first electrode 511 is formed. Although a method of selectively forming the wiring 512 is not particularly limited, a printing method is favorable since it is inexpensive. As a wiring formation method using a printing method, a method of applying an ink containing fine particles of silver using a dispenser or an inkjet, or a method of screen printing can be given as an example.

By using the above method, the photoelectric conversion element 500 illustrated in FIG. 5D can be formed.

Modification Example

Figure 6A:
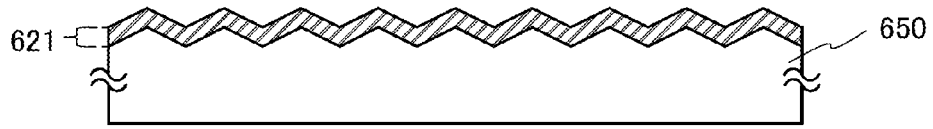
FIGS. 6A to 6D are diagrams for explaining a manufacturing method of a photoelectric conversion element according to an embodiment.
Figure 6B:
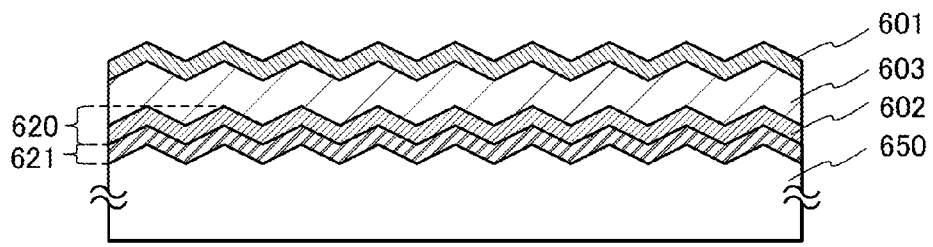
Figure 6C:
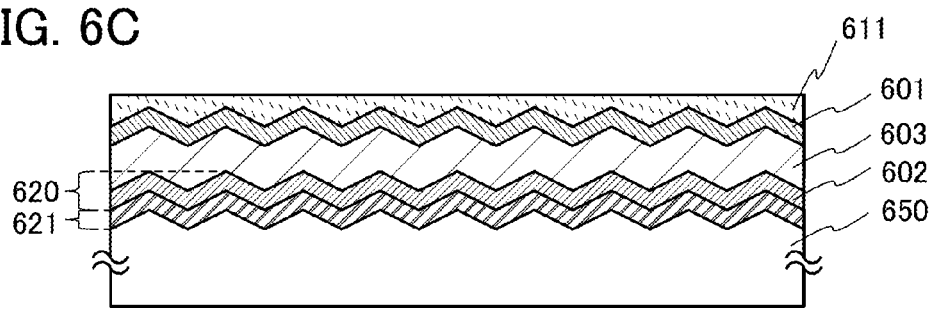
Figure 6D:
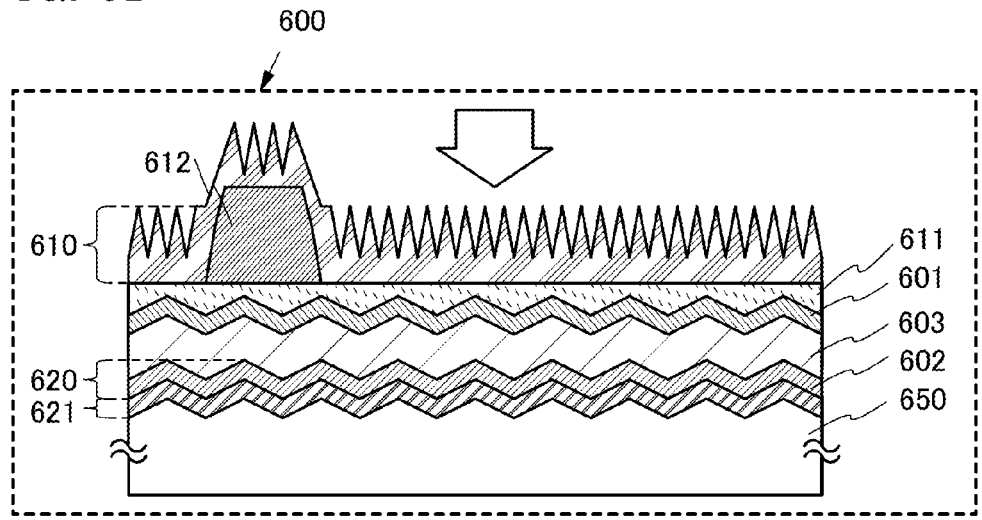

A structure of a photoelectric conversion element that is a modification example of this embodiment and a manufacturing method thereof will be described with reference to FIGS. 6A to 6D. A structure of a photoelectric conversion element 600 that is a modification example of this embodiment is illustrated in FIG. 6D. The photoelectric conversion element 600 illustrated in FIG. 6D and the photoelectric conversion element 500 illustrated in FIG. 5D have different structures of fine periodic structure and manufacturing methods thereof. Here, the structure and manufacturing method of the fine periodic structure in the photoelectric conversion element 600 will be mainly explained, and for other portions that can be formed using the same material, method, and condition as the photoelectric conversion element 500, description of the photoelectric conversion element 500 will be referenced.

A structure of a photoelectric conversion element that is a modification example of this embodiment is illustrated in FIG. 6D. A photoelectric conversion element 600 includes a photoelectric conversion layer 603 made of amorphous silicon. The photoelectric conversion layer 603 is provided with a first semiconductor layer 601 made of amorphous silicon with one conductivity type on a light-receiving surface side, a first electrode 611 that is electrically connected to the first semiconductor layer 601, and a wiring 612. Also, on another surface side of the photoelectric conversion layer 603, a second semiconductor layer 602 made of amorphous silicon with a conductivity type that is opposite the one conductivity type, and a reflective electrode 621 are provided. Furthermore, a fine periodic structure 610 is provided to be in contact with the first electrode 611, and a micro-texture structure 620 is provided on the other surface side of the photoelectric conversion layer 603. Also, the reflective electrode 621 is provided in a manner that is in contact with the micro-texture structure and electrically connected to the second semiconductor layer 602.

[Formation Method of Micro-Texture of Modification Example]

The photoelectric conversion element 600 is formed over a substrate in the same manner as the photoelectric conversion element 500. A substrate 650 over which the photoelectric conversion element 600 is formed can be the same kind of substrate as the substrate for the photoelectric conversion element 500. Also, over one surface of the substrate 650, a structure serving as a matrix of a micro-texture is formed by the same method as the photoelectric conversion element 500.

In a modification example of this embodiment, soda glass is used for the substrate 650, and the structure serving as the matrix is formed by a sand-blasting method.

[Formation Method of Reflective Electrode of Modification Example]

Next, the reflective electrode 621 is formed by forming a conductive film over the structure serving as the matrix of the micro-structure, using the same method as the photoelectric conversion element 500. A structure at this point is illustrated in FIG. 6A.

[Formation Method of Micro-Texture and pin Structure of Modification Example]

Next, using the same method as the photoelectric conversion element 500, the second semiconductor layer 602 made of an n-type amorphous silicon semiconductor is formed over the reflective electrode 621, and the photoelectric conversion layer 603 made of an i-type amorphous silicon semiconductor is formed over the second semiconductor layer 602.

Since the structure serving as the matrix of the micro-texture is formed over the substrate 650, a micro-texture is formed on a side of the photoelectric conversion layer 603 that is in contact with the second semiconductor layer 602, which has structures with an aspect ratio of 0.5 or more and 3 or less with a period of 2 µm or more and 100 µm or less, preferably 2 µm or more and 10 µm or less.

The first semiconductor layer 601 made of a p-type amorphous silicon semiconductor is formed over the photoelectric conversion layer 603. In the modification example of this embodiment, it is not necessary to form the first semiconductor layer 601 with a particularly thick thickness, and the first semiconductor layer 601 may be formed with a thickness of about 10 nm, for example. A structure at this point is illustrated in FIG. 6B.

Note that by providing the i-type photoelectric conversion layer 603 between the n-type second semiconductor layer 602 and the p-type first semiconductor layer 601, a pin structure is formed.

[Formation Method of First Electrode and Wiring]

Next, the first electrode 611 is formed in contact with the first semiconductor layer 601. The first electrode 611 is formed using a conductive film that has a light-transmitting property with respect to light that is absorbed by the photoelectric conversion layer 603. For example, a conductive film containing one of indium tin oxide, tin oxide, and zinc oxide, or the like can be used. A structure at this point is illustrated in FIG. 6C.

Next, the wiring 612 that is electrically connected to the first electrode 611 is formed. Although a method of selectively forming the wiring 612 is not particularly limited, a printing method is favorable since it is inexpensive. As a wiring formation method using a printing method, a method of applying an ink containing fine particles of silver using a dispenser or an inkjet, or a method of screen printing can be given as an example.

[Formation Method of Fine Periodic Structure of Modification Example]

Next, the fine periodic structure 610 is formed in contact with the first electrode 611. The fine periodic structure 610 may be formed by attaching over the first electrode 611 a film over which a fine periodic structure is formed in advance, using an adhesive agent. Note that as a method of forming the fine periodic structure over the film, a method of manufacturing an original plate using a resist mask formed by using an electron beam or ultraviolet light and then molding a thermoplastic resin, a photo-curing resin, or the like using the original plate, that is, a so-called nanoimprinting method can be used.

Using the above method, the photoelectric conversion element 600 illustrated in FIG. 6D can be formed.

According to the method described in this embodiment, a photoelectric conversion element with high conversion efficiency can be provided, which has a structure including the photoelectric conversion layer, the fine periodic structure on the light-receiving surface side of the photoelectric conversion layer, the micro-texture structure on the other surface side of the photoelectric conversion layer, and the reflective electrode that is in contact with the micro-texture structure.

Note that this embodiment can be freely combined with any of the other embodiments in this specification.

Example

In this example, a phenomenon in which light that is incident on a fine periodic structure provided on a light-receiving surface side of a photoelectric conversion layer is trapped in the photoelectric conversion layer, is described using calculation results. Specifically, the phenomenon in which light is trapped in the photoelectric conversion layer being dependent on incidence angle will be described with reference to FIGS. 7A and 7B and FIGS. 8A and 8B.

Figure 7A:
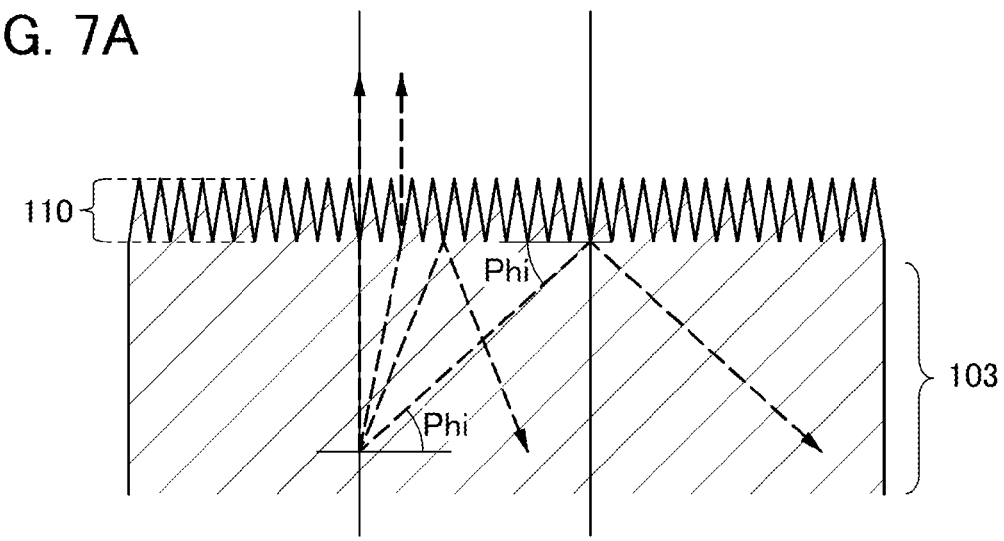
FIGS. 7A and 7B are each a diagram for explaining a calculation model according to an example.
Figure 7B:
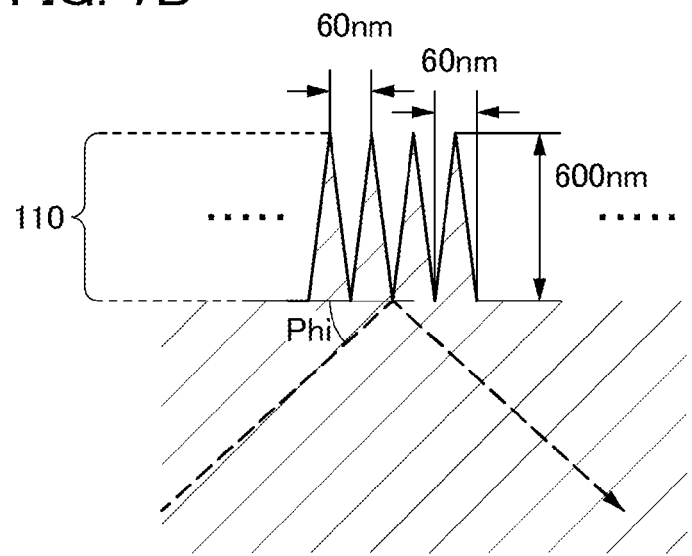

In a calculation model used in this example, the fine periodic structure 110 made of single crystal silicon is formed on a light-receiving surface side of the photoelectric conversion layer 103 made of a single crystal silicon substrate (see FIG. 7A). In the fine periodic structure 110, structures with an aspect ratio of 10 (specifically, structures each with a width of 60 nm and a height of 600 nm) are arranged in a period of 60 nm (see FIG. 7B).

The phenomenon in which light is trapped in the photoelectric conversion layer was confirmed by calculating a proportion of transmission of the light that is incident on the fine periodic structure from a photoelectric conversion layer 103 side to an atmosphere side. Specifically, total transmittance to the atmosphere side was calculated for the light that is incident on the fine periodic structure 110, which is in contact with the atmosphere, at an angle Phi with respect to a direction that is perpendicular to the light-receiving surface of the photoelectric conversion layer. An increase in total transmittance means an increase in light leakage from the photoelectric conversion layer 103 to the atmosphere side, and the closer the total transmittance is to 0, the less easily light is leaked from the photoelectric conversion layer 103 to the atmosphere side; that is, light is trapped in the photoelectric conversion layer. Note that total transmittance refers to a proportion of intensity of light that is incident at the angle Phi to an integration of light that pass through the fine periodic structure at various angles.

As calculation software, "Diffract MOD Ver. 3.2.0.1" manufactured by RSoft Design Group Japan KK was used. The calculation model was two dimensional, and an X-axis was set in a direction that was parallel to the light-receiving surface of the photoelectric conversion layer, and a Z-axis was set in a perpendicular direction thereto. Harmonics of the X-axis direction was set at 115, and Index Res. was set at a value obtained by dividing the period width 60 nm by $2^9$. Furthermore, the Index Rex. of the Z-axis direction was set at 10 nm.

Figure 8A:
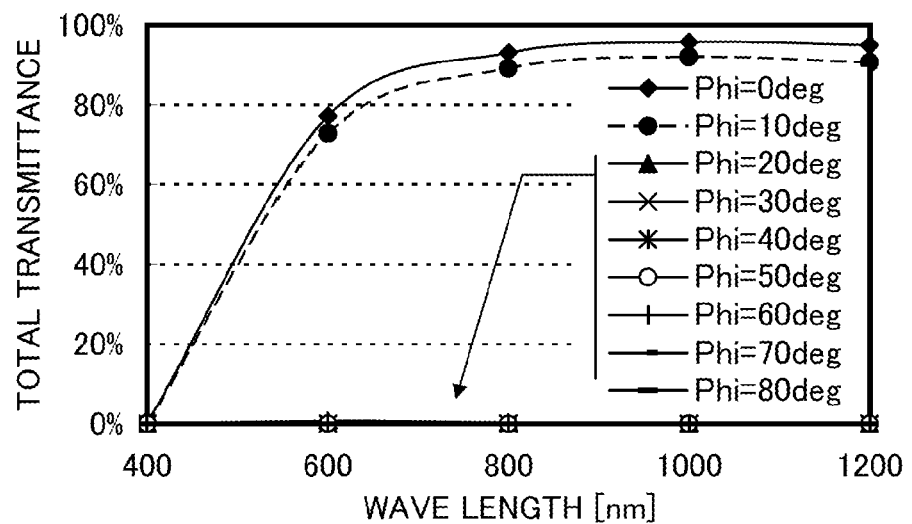
FIGS. 8A and 8B are each a graph for explaining a calculation result according to an example.
Figure 8B:
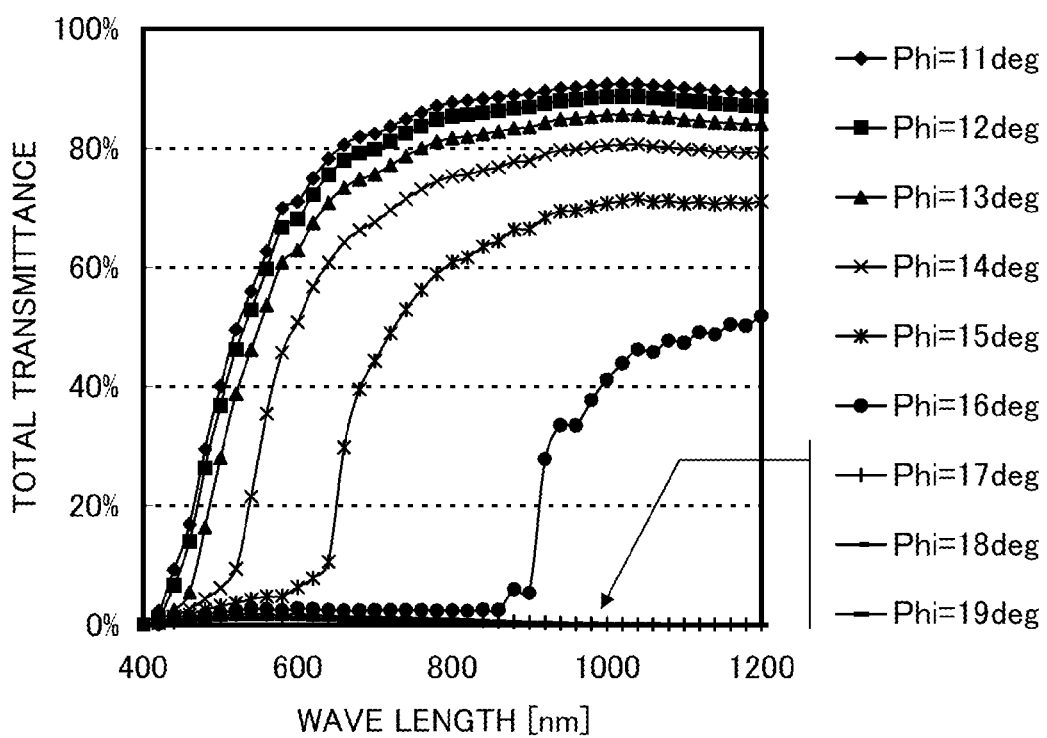

Calculation results are shown in FIGS. 8A and 8B. FIG. 8A shows results of calculating total transmittance every 10° from a case of being incident on the fine periodic structure 110 at 0° (that is, perpendicular direction to the light-receiving surface of the photoelectric conversion layer) to a case of being incident at 80°. Also, FIG. 8B shows results of calculating total transmittance every 1° from a case of being incident on the fine periodic structure 110 at 11° (that is, 11° with respect to the perpendicular direction to the light-receiving surface of the photoelectric conversion layer) to a case of being incident at 19°.

It can be confirmed from FIG. 8A that when the incidence angle Phi changes from 10° to 20°, total transmittance drastically drops, and light becomes trapped in the photoelectric conversion layer. Also, the phenomenon in which light is trapped in the photoelectric conversion layer can be confirmed from FIG. 8B, which shows that total transmittance changes relatively slowly when the incidence angle Phi is 11° to 13°, and then drastically drops when it becomes 14° or more. In this manner, due to the light trapped in the photoelectric conversion layer heavily depending on incidence angle from the photoelectric conversion layer 103 side to the fine periodic structure, by providing the fine periodic structure on the light-receiving surface side of the photoelectric conversion layer and providing a micro-texture structure on another surface side of the photoelectric conversion layer, light that has passed through the fine periodic structure and entered the photoelectric conversion layer can be trapped in the photoelectric conversion layer.

In this example, the phenomenon in which light that is incident on the fine periodic structure is trapped in the photoelectric conversion layer was shown using the calculation results. As it is clear from these results, it becomes possible to trap light in a photoelectric conversion layer by having a structure according to an embodiment of the present invention, which includes a photoelectric conversion layer, a fine periodic structure on a light-receiving surface side of the photoelectric conversion layer, a micro-texture structure over another surface of the photoelectric conversion layer, and a reflective electrode that is in contact with the micro-texture structure. By applying such a structure, a photoelectric conversion element with high conversion efficiency can be provided.

This application is based on Japanese Patent Application serial no. 2010-282126 filed with Japan Patent Office on Dec. 17, 2010, the entire contents of which are hereby incorporated by reference.

What is claimed is:

1. A photoelectric conversion element comprising:
    a photoelectric conversion layer;
    a fine periodic structure over a first surface of the photoelectric conversion layer;
    a micro-texture structure beneath a second surface of the photoelectric conversion layer; and
    a reflective electrode beneath the micro-texture structure,
    wherein the fine periodic structure comprises microstructures with an aspect ratio of 3 or more and 15 or less with a period of 60 nm or more and 500 nm or less,
    wherein the micro-texture structure comprises structures with an aspect ratio of 0.5 or more and 3 or less with a period of 2 μm or more and 100 μm or less, and
    wherein the reflective electrode has reflectivity of 10% or more and less than 100%.

2. The photoelectric conversion element according to claim 1, wherein 10% or more and 99% or less of incident light with a light wavelength contributing to photoelectric conversion reaches the reflective electrode.

3. The photoelectric conversion element according to claim 1,
    wherein the micro-texture structure has a surface that forms an angle of 8° or more and less than 45° or 49° or more and less than 90° with respect to the first surface of the photoelectric conversion layer.

4. The photoelectric conversion element according to claim 1,
    wherein the fine periodic structure comprises a semiconductor with a first conductivity type; and the micro-texture structure comprises a semiconductor with a second conductivity type opposite the first conductivity type.

5. The photoelectric conversion element according to claim 1,
    wherein the photoelectric conversion layer comprises a single crystal silicon substrate; and the micro-texture structure has a surface along a crystal orientation of the single crystal silicon substrate.

6. The photoelectric conversion element according to claim 1,
    wherein the fine periodic structure is formed over the first surface of the photoelectric conversion layer by attaching a film over the photoelectric conversion layer.

* * * * *